United States Patent [19]
Cardiasmenos et al.

[11] Patent Number: 5,091,730
[45] Date of Patent: Feb. 25, 1992

[54] PULSE RADAR AND COMPONENTS THEREFOR

[75] Inventors: Apostle G. Cardiasmenos, Acton; Martin R. Blustine, Waltham, both of Mass.

[73] Assignee: Raytheon Company, Lexington, Mass.

[21] Appl. No.: 666,829

[22] Filed: Mar. 8, 1991

Related U.S. Application Data

[63] Continuation of Ser. No. 552,548, Oct. 31, 1983.

[51] Int. Cl.⁵ ............... G01S 13/44; G01S 7/285; F41G 7/22; H01L 27/14
[52] U.S. Cl. ............................ 342/153; 342/62; 342/53; 244/3.16; 455/330
[58] Field of Search ............... 342/62, 149, 153, 53; 455/327, 330; 343/720, 721; 244/3.16, 3.19; 250/338.1, 338.4, 345

[56] References Cited

U.S. PATENT DOCUMENTS

| | | | |
|---|---|---|---|
| 3,746,454 | 7/1973 | Pace et al. | 342/179 X |
| 4,276,655 | 6/1981 | Kraemer et al. | 455/327 |
| 4,461,039 | 7/1984 | Herman | 455/330 X |
| 4,491,977 | 1/1985 | Paul | 455/330 X |

OTHER PUBLICATIONS

"Change in the Characteristics of a Gaussian Beam Weekly Diffracted by a Circular Aperture", by P. Belland and J. P. Crenn, Appl Optics, vol. 21, 1982, pp. 522-527.
"Geometrical Representation of Gaussian Beam Propagation", by T. S. Chu, Bell Syst. Tech. J., vol. 45, 1966, pp. 287-299.
"Quasi-Optical Techniques at Millimeter and Submillimeter Wavelengths", by P. F. Goldsmith, Infrared and Millimeter Waves, vol. 6, K. Button (ED), Academic, NY 1982, pp. 277-343.
"An Adjustable Quasi-Optical Bandpass Filter Part I, Theory and Design Formulas", by A. A. M. Saleh, IEEE Trans. Microwave Theory Tech., MTT 22, 1974, pp. 728-739.
"Quarter Wave Plates for Submillimeter Wavelengths", by A. H. F. van Vliet and Th, de Graauw, Int. J. Infrared Millimeter Waves, vol. 2, 1981, pp. 465-477.
"A Method of Producing Broad-Band Circular Polarization Employing an Anisotropic Dielectric", by H. S. Kirschbaum and S. Chen, IRE Trans. on Microwave Theory & Tech. MTT-5, 1957, pp. 199-203.
"Quasi-Optics in Millimeterwave Systems", by P. F. Goldsmith, Proc. 12th European Microwave Conference, Helsinki, 1982, pp. 16-24.
"Microstrip Components for Low Cost Millimeter Wave Missile Seekers", by K. G. Oltman, D. M. Weems, G. M. Lindgren and F. D. Walton, NATO AGARD Conference Proceedings, 1978.
"New Trends in Millimeter-Wave Mixer Technology", by J. Paul and J. King, Microwave Journal, May 1980.
"A Novel Polarization-Independent Beam Splitter", by Ryuichi Watanabe, IEEE Transactions on Microwave Theory and Techniques, vol. MTT-28, No. 7, Jul. 1980.
"A Hybrid Technology for Near-Millimeter Waves", by J. Hank Rainwater and R. W. McMillan, Microwaves, Jun. 1980, pp. 76-82.
"A Quasioptical Circuit Technology for Shortmillimeter-Wavelength Multiplexers", by Nobou Nakajima and Ryuichi Watanabe, IEEE Transactions on Microwave Theory & Tech., vol. TT-29, No. 9, Sep. 1981.
"Diffraction Loss in Dielectric-Filled Fabry-Perot Interferometers", by Paul F. Goldsmith, IEEE Transactions on Microwave Theory and Techniques, vol. MTT-30, No. 5, May 1982.

*Primary Examiner*—Gilberto Barrón, Jr.
*Attorney, Agent, or Firm*—Donald F. Mofford; Richard M. Sharkansky

[57] ABSTRACT

A pulse radar for operation at 94 GHz and higher frequencies is shown to include an antenna, a diplexer and first detector that are each optically fed so that radio frequency signals may be, when transmitting, passed through the diplexer to the antenna and, when receiving, from the antenna through the diplexer to the first detector.

19 Claims, 7 Drawing Sheets

PULSE RADAR AND COMPONENTS THEREFOR

This application is a continuation of application Ser. No. 552,548 filed Oct. 31, 1993.

BACKGROUND OF THE INVENTION

This invention pertains generally to radar seekers for use in guided missiles, and particularly to active seekers operating at frequencies wherein optical techniques may be used to reduce the size, lower the cost, and improve the performance of such seekers.

Anti-armor weapon systems, employing terminally guided submunitions, are being developed to autonomously seek, identify and attack armored targets in a high ground clutter background. In order to provide all weather capability such submunitions will generally employ millimeter-wave radar seekers, and in order to attain the requisite degree of target discrimination the millimeter-wave seeker must employ a relatively sophisticated radar system as, for example, a synthetic aperture radar system or a polarimetric radar system. Either such type of radar is, however, relatively complex. The complexity of such radar system will be appreciated when it is recognized that at an operating frequency of, say, 94 GHz, conventional waveguide dimensions are in the order of 0.050 to 0.100 inches, with tolerances of better than 0.001 inches required in many critical assemblies. Although it may be possible to fabricate such millimeter-wave hardware at somewhat reduced cost using modern robotic techniques, the expense associated with tuning and testing such critically toleranced hardware may well prove to be prohibitive.

The problems of packaging and tuning an active millimeter-wave seeker in a conventional submunition will be appreciated when it is recognized that a polarimetric or dual polarization monopulse seeker without a monopulse tracking capability utilizing waveguide components may well require in excess of twenty different waveguide components to control the routing and diplexing of the various signals coming from the transmitter and returning to the receivers. If a monopulse tracking capability were required, then all of the foregoing waveguide components would be required to track each other in both amplitude and phase. At an operating frequency of 94 GHz, each one thousandth of an inch in a waveguide assembly is equivalent to about 2° of phase. It should therefore be appreciated that obtaining the requisite phase and amplitude tracking between the various channels is extremely difficult at best.

Another problem inherent in active millimeter-wave radar seekers utilizing waveguide devices is that of providing sufficient isolation between the transmitter and receiver. This problem is exacerbated by the fact that waveguide switches and circulators providing a high degree of isolation are not generally available at an operating frequency of 94 GHz. Consequently, it is generally required to turn the transmitter off during the interpulse periods of the radar to realize the requisite isolation. This approach, however, requires the use of a complex phase lock control loop, such as that described in copending U.S. application (now U.S. Pat. No. 4,470,049 issued Sept. 4, 1984) Ser. No. 356,696 filed Mar. 3, 1982 and assigned to the same assignee as the present application, to insure that the phase of the transmitter is properly controlled during the pulse transmission periods.

Another problem inherent in millimeter-wave radar systems utilizing waveguide components is that of a relatively low operating bandwidth due primarily to the critical waveguide tolerances. A relatively narrow operating bandwidth increases the susceptibility of the millimeter-wave radar to electronic countermeasures.

SUMMARY OF THE INVENTION

With this background of the invention in mind it is therefore a primary object of this invention to provide a low cost and low volume active millimeter-wave radar seeker.

It is another object of this invention to provide a millimeter-wave radar system having improved isolation between transmit and receive channels.

It is yet another object of this invention to provide a broadband active millimeter-wave seeker.

It is still another object of this invention to provide an active millimeter-wave radar seeker having monopulse tracking capability, such seeker being more compact than known seekers of such type.

It is a further object of this invention to provide an active millimeter-wave radar seeker capable of transmitting and receiving circular or linear polarizations.

The foregoing and other objects of this invention are generally attained by providing an active millimeter-wave seeker wherein an optical diplexer is utilized to provide the requisite isolation between the transmitter and receiver as well as a polarization twisting capability that permits the transmission of a circularly polarized signal and the simultaneous reception of both right and left-handed circularly polarized return signals. The diplexer is optically coupled to an antenna system comprising a hyperbolic 45° reflector, a parabolic reflector and an ellipsoidal flat plate scanning reflector. Both left and right hand circularly polarized return signals are converted by the diplexer into corresponding plane (linearly) polarized signals that are provided at corresponding output ports of the diplexer. The output signals from the diplexer are optically coupled to radio frequency (R.F.) mixer arrays within an R.F. receiver for downconversion to a 500 MHz first intermediate frequency (I.F.) by being heterodyned with a local oscillator signal that is optically coupled from the transmitter output channel to the R.F. mixer arrays. The I.F. output signals from the mixer arrays are combined in conventional monopulse comparators and the resulting sum and difference signals, corresponding to each received polarization, are quadrature detected, digitized, and provided as input signals to a conventional digital signal processor to derive the requisite guidance command signals.

BRIEF DESCRIPTION OF THE DRAWINGS

Other objects and many of the attendant advantages of the invention will be readily appreciated as the same become better understood by reference to the following detailed description when considered in connection with the accompanying drawings wherein.

DESCRIPTION OF THE PREFERRED EMBODIMENT

Figure 1:
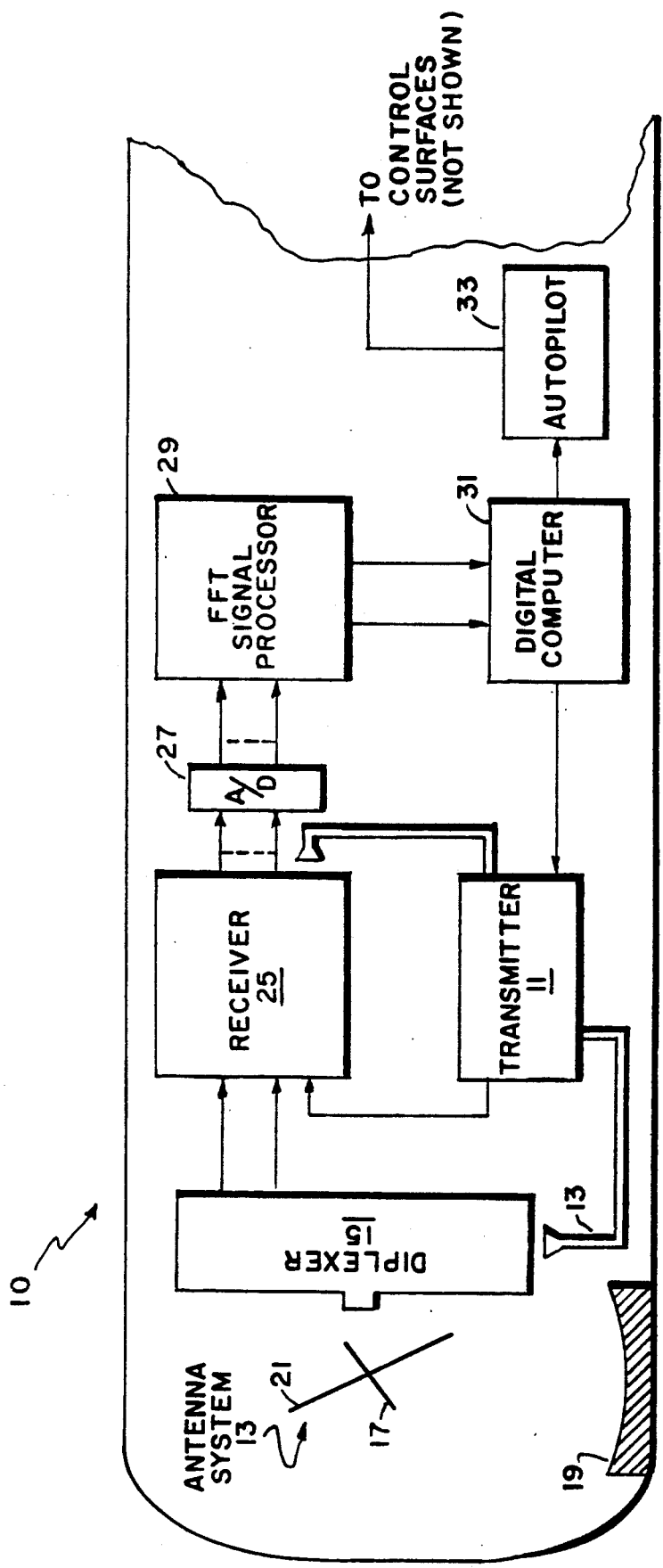
FIG. 1 is a simplified block diagram of an active millimeter-wave seeker according to this invention.

Referring now to FIG. 1, an active millimeter-wave radar seeker 10 according to this invention is shown to include a transmitter 11 that is coupled, via a conventional horn antenna 13, to a diplexer 15. The latter, which will be described in detail hereinbelow, is effective to convert signals from the transmitter 11 to circularly polarized output signals for an antenna system that will be described in detail hereinbelow with reference to FIGS. 1A and 1B. Suffice it to say here that the antenna system comprises a hyperbolic mirror 17 inclined at an angle of 45°, a paraboloidal mirror 19, and an ellipsoidal flat plate scanning mirror 21 that is affixed to a conventional gimbal system (not shown). In the transmit mode 94 GHz radiation incident on the fixed 45° mirror 17 is directed, via the paraboloidal mirror 19, to the ellipsoidal flat plate scanning mirror 21. It will be appreciated by those of skill in the art that the ellipsoidal flat plate reflector 21 is effective to scan energy incident thereon through an angle twice that of the gimbal angle. In the receive mode reciprocity holds so that radar return signals incident on the ellipsoidal flat plate scanning mirror 21 are directed, via the spherical mirror 19 and the fixed 45° mirror 17, to the diplexer 15. In the receive mode the diplexer 15 is effective to resolve both left and right-handed circularly polarized (corresponding to reflections from either "single bounce" or "double bounce" objects) return signals into the plane (linear) polarized signals and to optically couple such plane polarized signals to a receiver 25 described in detail hereinbelow with reference to FIGS. 6 and 7. A local oscillator signal that is generated within the transmitter 11 is also applied, via a horn antenna 27, to the receiver 25. The receiver 25 is effective to: (a) downconvert radar return signals to first I.F. signals at, say, 500 MHz; (b) form monopulse sum and difference signals at that I.F. frequency; (c) upconvert the first I.F. signals to a second I.F. frequency of 1 GHz; and (d), quadrature detect the monopulse sum and difference signals. The output signals from the receiver 25 are digitized in an analog-to-digital (A/D) converter 27 and are provided as input signals to a Fast Fourier Transform (FFT) signal processor 29. The latter is effective to perform the target detection function in a known manner. The output signals from the FFT processor 29 are passed to a digital computer 31, which here may be a Model 8086 sixteen-bit microprocessor from Intel Corporation, Santa Clara, CA 95051, that is effective to perform, inter alia, the target tracking and the radar timing. The guidance control signals developed within the digital computer 31 are passed to a conventional autopilot 33 wherein the requisite control signals for the submunition control surfaces (not shown) are generated.

Figure 1A:
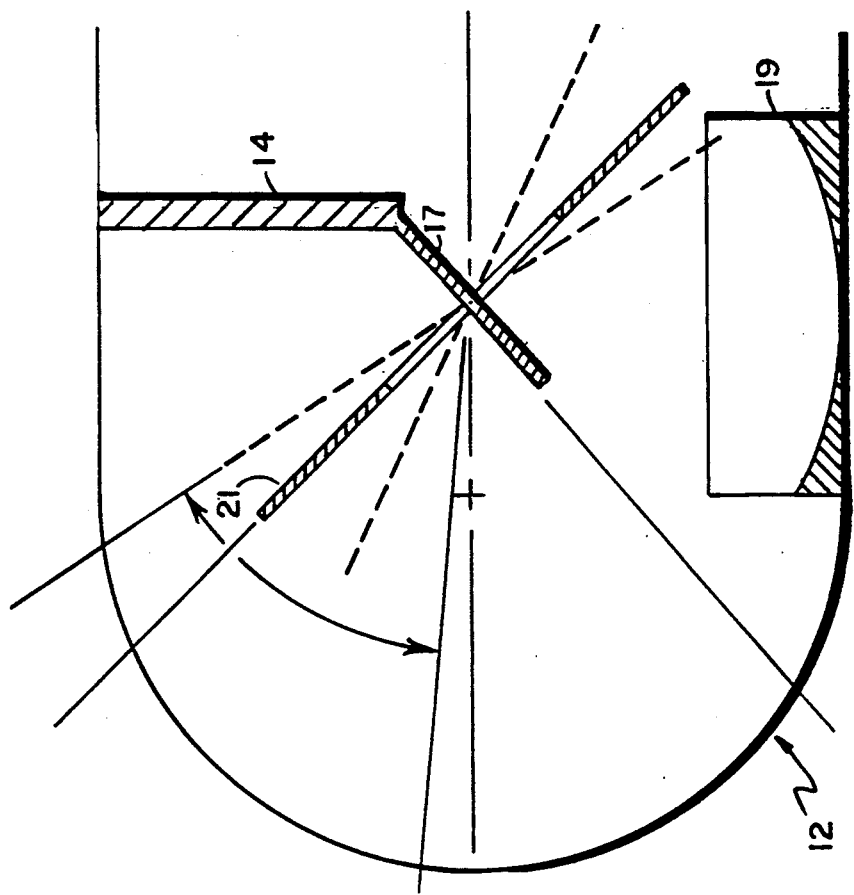
FIGS. 1A and 1B are, respectively, cross-sectional and plan views of the antenna system of FIG. 1.
Figure 1B:
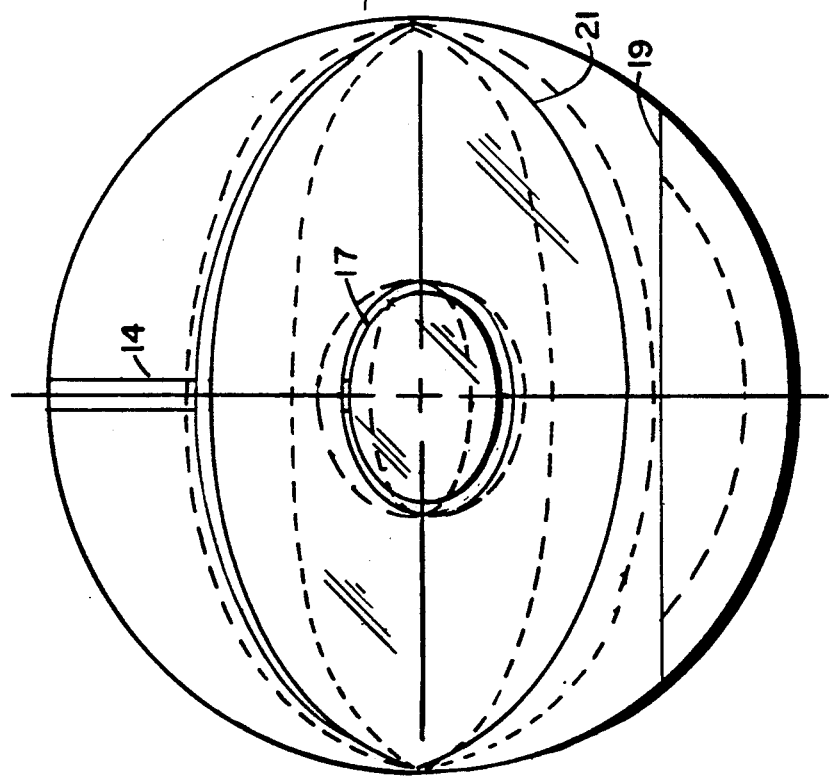

Referring now to FIGS. 1A and 1B, the contemplated scanning mirror antenna system is shown to include a fixed 45° mirror 17 that is inclined at an angle of 45° with respect to the longitudinal axis of the submunition (not numbered). The fixed 45° mirror 17 is supported by a support post 14 that is attached to the body of the submunition (not numbered) and the center of fixed 45° mirror 17 is coincident with the focal point of the output lens of the diplexer 15 (FIG. 1). In the transmit mode, the fixed 45° mirror 17 is effective to direct the 94 GHz radiation incident thereon to a paraboloidal mirror 19 that extends along half of the inner circumference of the submunition (not numbered). The paraboloidal mirror 19 is shaped so as to direct a substantially collimated beam onto the elliptical flat plate mirror 21. With the elliptical flat plate mirror 21 mounted on conventional gimbals (not shown), the substantially collimated beam here may be scanned through an azimuth angle of at least ±30° and a minimum total scan angle of 52° in elevation. The elliptical flat plate mirror 21 has a clearance hole (not numbered) provided in the center thereof for the fixed 45° mirror 17. The elliptical shape of the flat plate scanning mirror is required to prevent beam obscuration during vertical and horizontal scans. The rear surface (not numbered) of the fixed 45° mirror 17 is coated with R.F. absorbing material (not shown) in order to minimize the problem of secondary reflections of the radar return signals 25 that are incident directly thereon.

Figure 2:
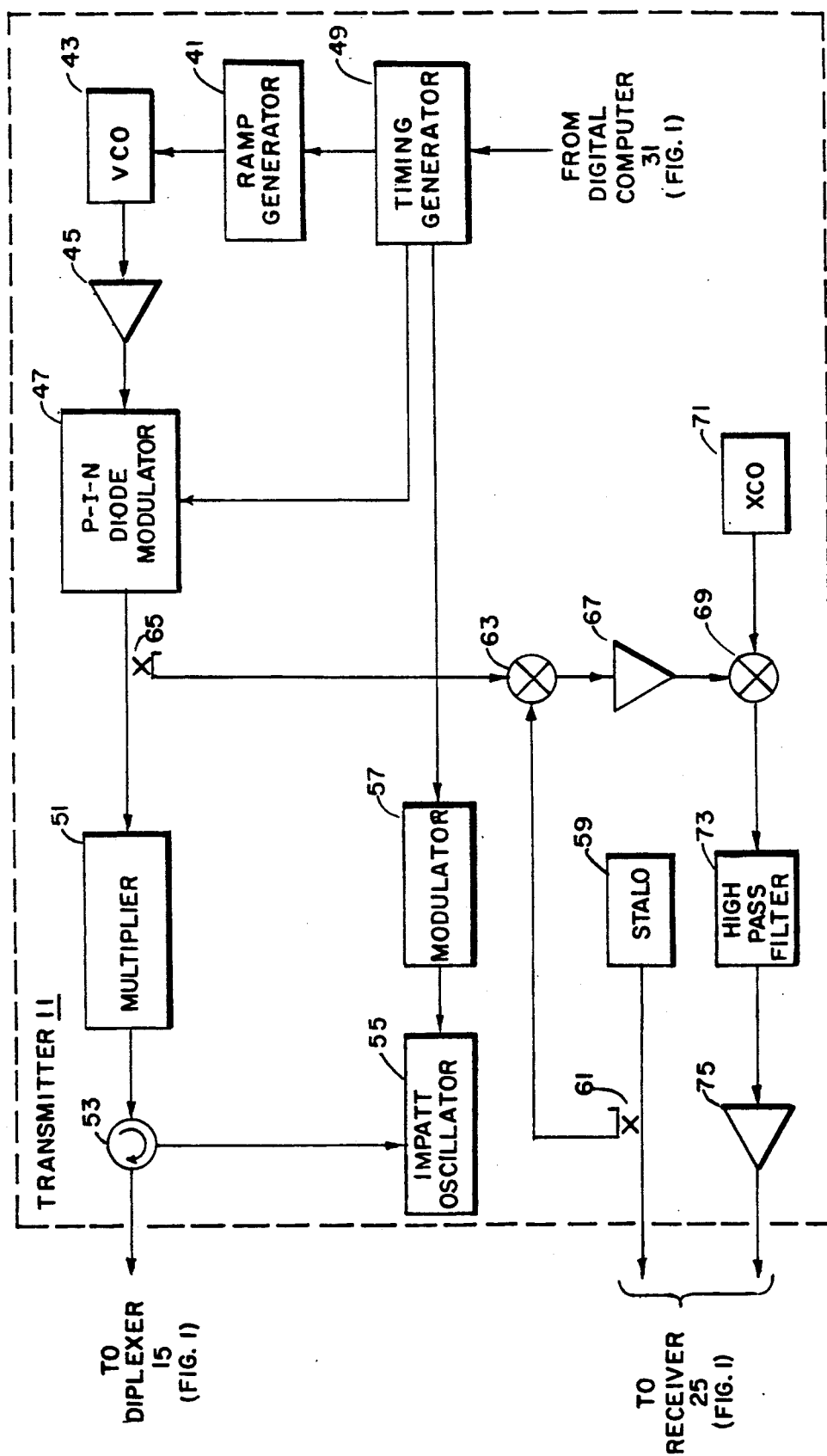
FIG. 2 is a simplified block diagram of the transmitter of FIG. 1.

Referring now to FIG. 2, the transmitter 11 will be described in detail. Before proceeding, however, it should be noted that, for signal processing purposes, the herecontemplated millimeter-wave radar seeker 10 (FIG. 1) utilizes a chirp (linear frequency-modulated) waveform. Such a chirp waveform is here generated by applying a voltage ramp waveform as a control signal to a Ku-band voltage-controlled oscillator (VCO) 43 that here is tunable over a frequency range from 15.66 GHz to 15.75 GHz. The voltage ramp waveform is generated in a conventional voltage ramp generator 41 in response to a control signal provided by a timing generator 49. The latter, in turn, is shown to be controlled by a control signal provided by the digital computer 31 (FIG. 1). The chirp waveform from the VCO 43 is amplified in a field effect transistor (FET)amplifier 45, the output signal from which is applied to an absorption P-I-N diode modulator 47, which is effective to generate pulse waveforms in response to control signals provided by the timing generator 49. The chirp pulse waveforms from the absorptive P-I-N diode modulator 47 are frequency-multiplied in a varactor diode multiplier 51 to provide output signals from 94.0 GHz to 94.5 GHz. Such output signals are passed, via a circulator 53, as injection locking signals to an IMPATT diode oscillator 55. The latter, which is here a single diode device, is modulated by an IMPATT diode modulator 57 that is in turn triggered by a control signal from the timing generator 49. The amplified output signals from the IMPATT diode oscillator 55, which are here at a level of approximately 150 milliwatts, are passed, via the circulator 53 and the horn antenna 13 (FIG. 1), as input signals to the diplexer 15 (FIG. 1).

As mentioned briefly hereinabove, the L.O. signals for the receiver 25 (FIG. 1) are also generated within the transmitter 11. The L.O. signals are provided by a 93.90 GHz stable local oscillator (STALO) 59 which is here a Gunn diode oscillator. As the latter is not chirped, a second chirped L.O. signal must be provided to the receiver 25 (FIG. 1) in order to de-chirp the radar return signals. Such second L.O. signal is generated by coupling, in a directional coupler 61, a portion of the output signal from the STALO 59 to a harmonic mixer 63. The second input signal to such mixer is obtained by coupling, via a coupler 65, a portion of the chirped output signal from the FET amplifier 45. The resulting I.F. output signal from the harmonic mixer 63 is amplified in an amplifier 67 prior to being upconverted to a L-band signal by being heterodyned in a mixer 69 with the output signal from a 1.0 GHz crystal-controlled oscillator (XCO) 71. The output signals from the mixer 69 are filtered in a high pass filter 73 which is effective to pass only the upper sideband signal from the mixer 69. The resulting 1.10 to 1.60 GHz output signal from the filter 73 is amplified in an amplifier 75 prior to being provided as the second L.O. signal to the receiver 25 (FIG. 1).

Figure 3:
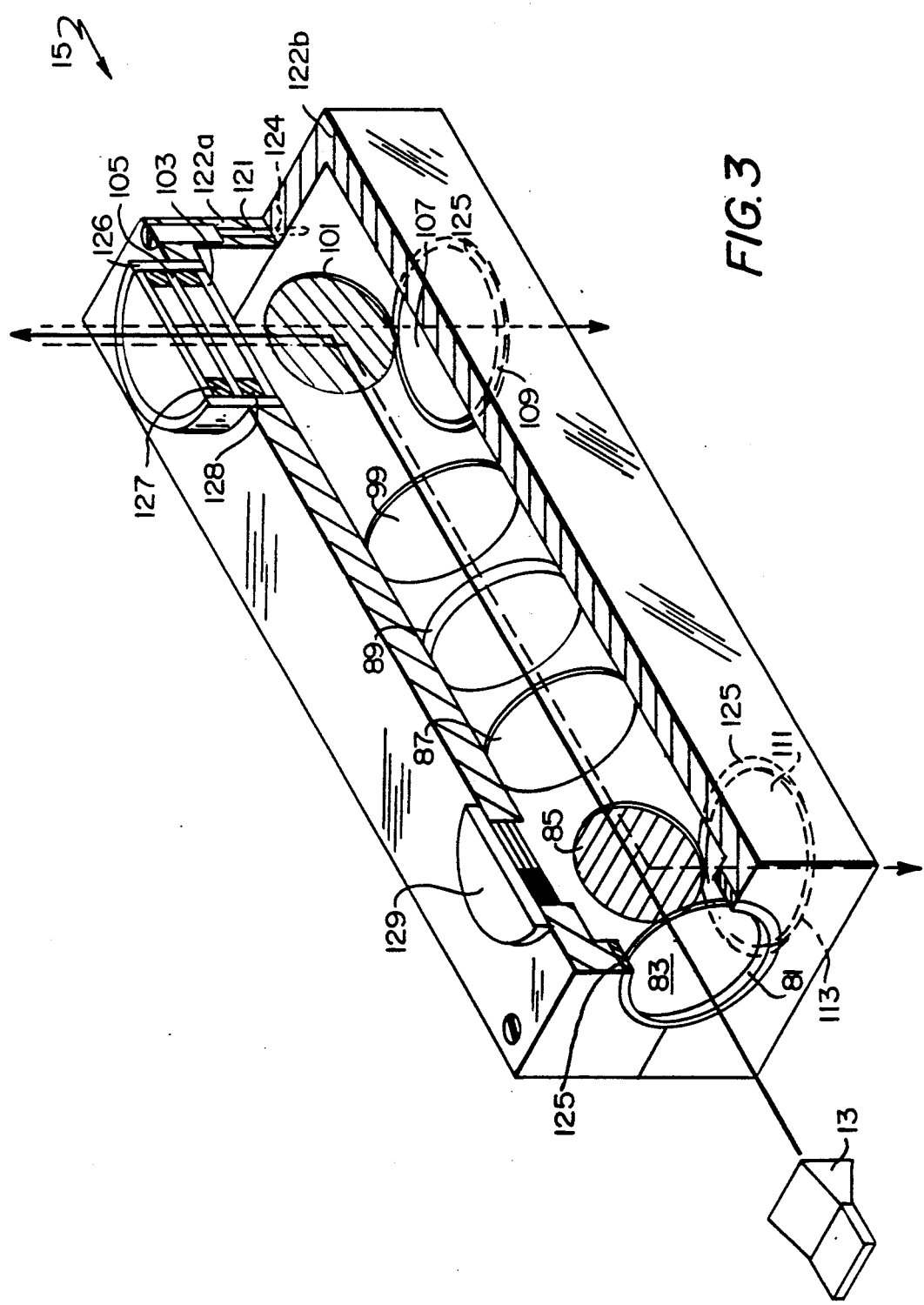
FIG. 3 is a cross-sectional view of the diplexer of FIG. 1 in accordance with this invention.

Referring now to FIG. 3, the input port 81 of the diplexer 15 is shown to include a lens 83 which serves to collimate the 94 GHz signals received from the transmitter 11 (FIG. 2) via the horn antenna 13 (FIG. 1). The lens 83, which is here a Model No. 01LQB028 from Melles Griot, 1770 Kettering Street, Irvine, CA 92714 is a fuzed quartz lens having two convex surfaces. The lens 83 is approximately 0.800 inches in diameter and has a focal length of 1.0 inch. The lens 83 is coated with an anti-reflective layer of polyethylene (not shown) that is one-quarter wavelength thick in the dielectric medium (polyethylene having a relative dielectric constant of 2.0). The 94 GHz signals from the lens 83 are incident on a conventional polarization grid 85 that is inclined at an angle of 45° with respect to the vertical axis and here comprises an anti-reflection coated one-half wavelength thick quartz substrate having a pattern of parallel wire strips (not shown) deposited on one surface. Such parallel strips are oriented orthogonally to the vertical axis. When, as here, the electric (E) field of the incident signals is orthogonal to the wire strips (not shown), the strips appear to be capacitive and the signals will pass through the polarization grid 85 unimpeded. The 94 GHz signals exiting the polarization grid 85 traverse a second lens 87 that is identical to the lens 83 and to fall on a Faraday rotator 89.

Figure 4:
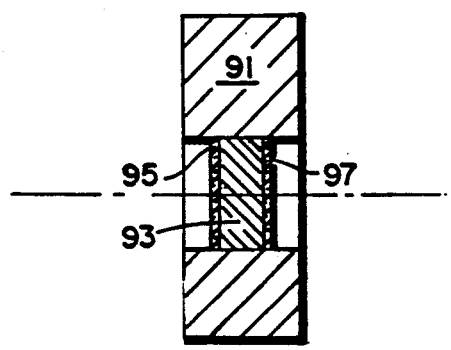
FIG. 4 is a cross-sectional view of the Faraday rotator employed in the diplexer of FIG. 1.

Referring briefly now to FIG. 4, the Faraday rotator 89 comprises an annular samarium cobalt permanent magnet 91 having a ferrite disk 93 disposed in the center thereof. The ferrite disk 93 is here a 0.550 inch diameter, 0.100 inch thick piece of magnesium ferrite material (here model TTl-3000 material from Trans-Tech, Inc. Gaithersbury, MD). Disposed on either side of the ferrite disk are 0.016 inch thick fuzed quartz matching disks 95, 97. The annular samarium cobalt magnet 91 is 1.50 inches in diameter and 0.500 inches thick and produces an axial field component in excess of 3000 Gauss. It will be appreciated by those of skill in the art that the Faraday rotator 89 is effective to rotate the direction of polarization for linearly polarized incident signals. Thus, when the Transverse E-field Component of the signals incident on the Faraday rotator 89 is parallel to the vertical axis, the transverse E-field component for the signals exiting the latter are rotated 45° (here in a counter-clockwise direction) with respect to the vertical axis.

Referring back now to FIG. 3, the signals exiting the Faraday rotator 89 traverse another lens 99 (identical to lenses 83 and 87) to a second polarization grid 101. The parallel strips (not shown) of such grid are at an angle of 45° with respect to the vertical axis. In consequence, then, the E-field of the incident signals is parallel to the metal strips so the signals are reflected to a lens 103 identical to lenses 83, 87 and 99. The signals out of the lens 103 are incident on a sapphire quarter-wave plate 105. The quarter-wave plate 105 is here 0.70 inches in diameter and 0.094 inches thick and has an anti-reflective layer of one-quarter wavelength thick MYLAR TM (not shown) coated on both surfaces. The quarter-wave plate 105 is effective to convert the linearly (plane) polarized signals incident thereon into circularly polarized output signals. For the optical path through the diplexer 15 just described, the resulting signals at the output of the quarter-wave plate 105 are right-hand circularly polarized.

In the receive mode, left-hand circularly polarized signals (corresponding to returns from so-called "single-bounce" scatterers such as clutter) incident on the quarter-wave plate 105 are converted, in a reciprocal manner to that just described hereinabove, into linearly (plane) polarized radiation wherein the E-field has a 45° orientation relative to the vertical axis, but an orthogonal orientation relative to the metal strips (not shown) on the polarization grid 101. Consequently, such linearly (plane) polarized signals, after traversing the lens 103, will pass through the polarization grid 101 and a lens 107 (identical to lenses 83, 87, 99 and 103) and will exit the so-called left-hand circular receive port 109.

Right-hand circularly polarized return signals (corresponding to returns from so-called "double-bounce" scatterers such as cultural objects) will be transformed by the quarter-wave plate 105 into linearly (plane) polarized signals wherein the E-field has a 45° orientation relative to the vertical axis and a parallel orientation relative to the metal strips (not shown) on the polarization grid 101. Such signals, after traversing the lens 103, are reflected by the polarization grid 101 back through the lens 99 to the Faraday rotator 89. In the receive mode that rotator, due to its nonreciprocal property, will rotate incident signals by 45° in the same direction (sense) as that of the transmitted signals, meaning that the signals exiting the Faraday rotator 89 have an E-field oriented 90° relative to the vertical axis and parallel with the metal strips on the polarization grid 85. Thus, such signals, after passing through the lens 87, will be reflected by the polarization grid 85 and directed through a lens 111 (identical to lenses 83, 87, 99, 103 and 107) to the so-called right-hand circular receive port 113.

The housing 121 for the diplexer 15 here comprises two half-sections 122a, 122b. The latter are molded plastic in order to both reduce weight and lower cost. Recesses (not numbered) are provided in each half-section 122a, 122b to retain the polarization grids 85, 101, the lenses 87, 99 and the Faraday rotator 89. The two half-sections 122a, 122b are fastened together in any convenient manner as by means of screws (not shown) inserted through clearance holes 123 provided in the upper section 122a to engage tapped holes 124 provided in the lower half-section 122b. A total of five threaded apertures (not numbered) are provided in the housing 121 for the various input and output lenses. Each one of the lenses 83, 107 and 111 is held in place in the housing 121 by means of plastic threaded collars 125. The two apertures (not numbered) provided in the upper half-section 122a are somewhat larger in diameter than the corresponding apertures (not numbered) provided in the lower half-section 122b. This is required to accommodate a threaded plastic element 126 for the lens 103 and the sapphire quarter-wave plate 105. The latter two elements are restrained in the housing 121 by means of a threaded plastic collar 127 and a spacer 128 is provided to separate the lens 103 from the quarter-wave plate 105. Finally, it should be noted that one of the apertures (not numbered) provided in the upper half-section 122a is enclosed by a cap 129.

Figure 5:
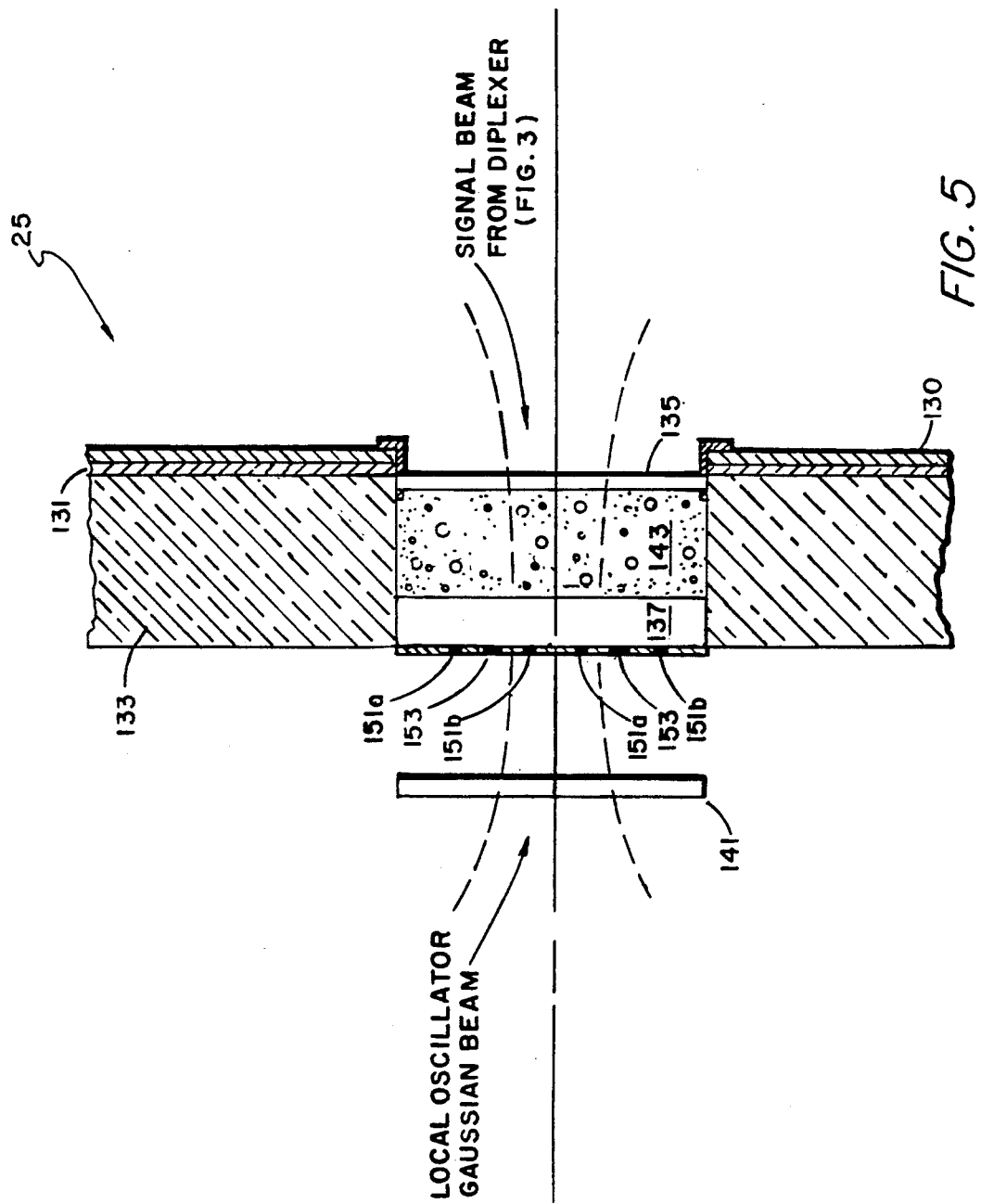
FIG. 5 is a sketch, somewhat simplified, illustrating how the diplexer of FIG. 3 is optically coupled to the receiver of FIG. 1.

Referring now to FIG. 5, the manner in which the output signals from the diplexer 15 (FIG. 3) are optically coupled to the receiver 25 will be described in detail. Before proceeding, however, it should be recalled that in the contemplated receiver 25 the 94 GHz input signals from the diplexer 15 (FIG. 3) are downconverted to first I.F. signals of, say, 100 MHz by being heterodyned with a 93.9 GHz L.O. signal from the transmitter 11 that is also optically coupled to the receiver 25. It should also be noted that the oppositely polarized input signals from the diplexer 15 (FIG. 3) are downconverted utilizing an array of four balanced mixers so that monopulse sum and difference signals may be formed at the first I.F. frequency for each of the oppositely polarized input signals. Finally, it should be noted that for the sake of drawing convenience only a single polarization channel of the dual polarization receiver 25 will be described in detail.

The 94 GHz radiation from the left-hand circular receive port 109 (FIG. 3) of the diplexer 15 (FIG. 3) is shown to be incident on the receiver 25 at an 0.800 inch diameter circular aperture provided through the receiver body 130 and then through ground plane 131 and dielectric 133 of a 1/32 inch Duroid TM microstrip board (not numbered) that supports the I.F. circuitry (not shown). Disposed at the entrance of the circular aperture is a polarization grid 135, here identical to polarization grid 101 (FIG. 3), whose metal strips are aligned orthogonally to the E-field of the incident signals so that such signals will pass therethrough. Such signals also traverse a quartz substrate 137 supporting the mixer arrays (FIG. 6) to be described in detail hereinbelow with reference to FIG. 6. The quartz substrate 137 and therefore the mixer arrays are located at a point corresponding to the focal point of the lens 107 (FIG. 3). The 94 GHz signals exiting the quartz substrate 137 are incident on a second polarization grid 141 whose metal strips (not shown) are aligned parallel to the E-field of such signals. Consequently, such signals are reflected back onto the quartz substrate 137 to be coupled to the mixer diodes (shown in detail in FIG. 6). The polarization grid 141 may be moved axially within a housing (not shown) with respect to the quartz substrate 137, in order to control the amount of 94 GHz signals coupled to the mixer diodes and to match the complex impedance of the mixer diodes.

The 93.9 GHz L.O. signal from the horn antenna (not numbered) (FIG. 1) is coupled through the polarization grid 141 and the quartz substrate 137 to the polarization grid 135 from where it is reflected back onto the quartz substrate 137. The manner in which the 93.9 GHz L.O. signal couples to the mixer diodes will be described in detail hereinbelow with reference to FIG. 6. Suffice it to say here that the polarization grid 135 may also be moved axially within a housing (not shown) with respect to the quartz substrate 137 to control the coupling of the 93.9 GHz L.O. signal to the mixer diodes and to match the complex impedances.

It should be noted here that the quartz substrate 137 is only approximately 0.007 inches thick and therefore the substrate 137 is embedded in a dielectric foam material (here Eccofoam FPH material, Emerson-Cummings, Canton, MA) in order to provide for structural rigidity.

Figure 6:
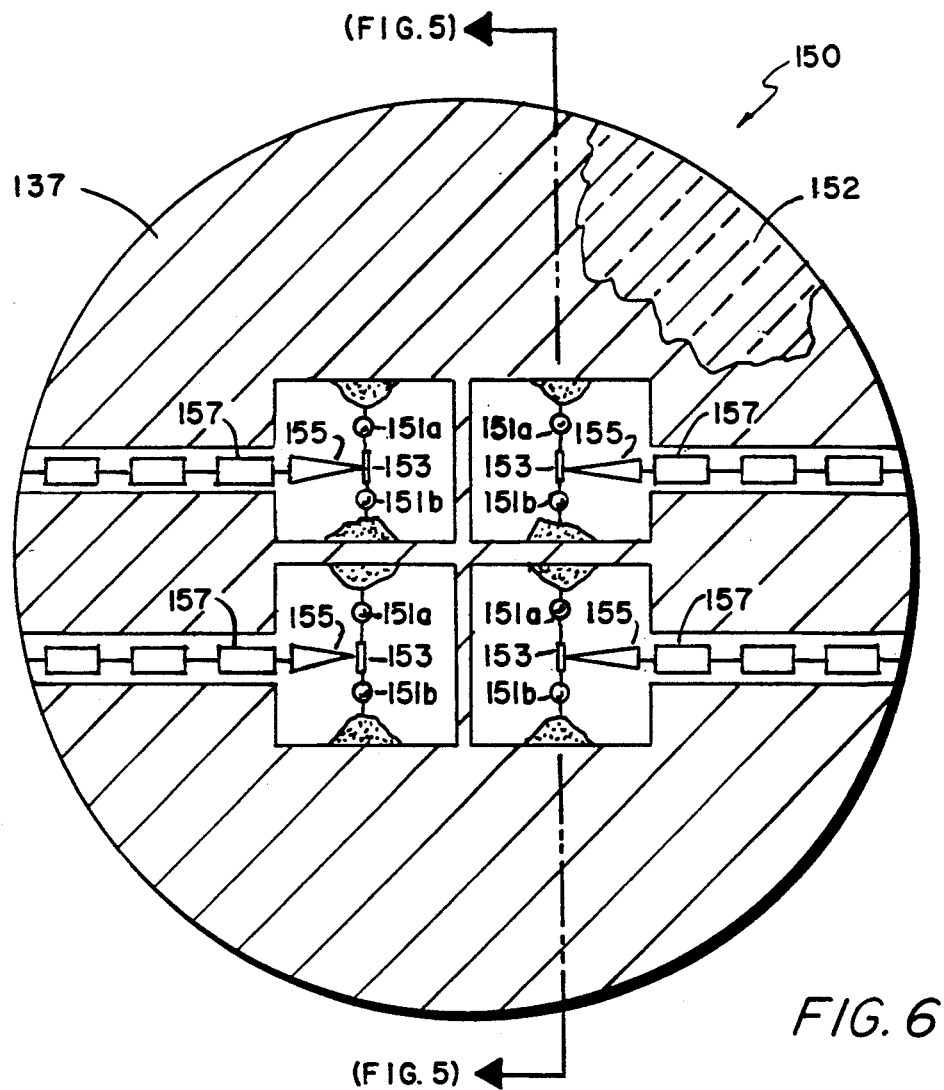
FIG. 6 is a plan view of one of the mixer arrays of the receiver of FIG. 5.

Referring now to FIG. 6, a mixer array 150 as herein contemplated is shown to include four mixers 156 formed by etching four square apertures (also not numbered) in the metallic plating 152 provided on the top surface of the quartz substrate 137. Each mixer 156 is shown to include a pair of beam lead diodes 151a, 151b which are here Model DC 1346 devices from Marconi Electronic Devices, Doddington Road, Lincoln, Great Britain. The latter are connected in series so that the anode of diodes 151a and the cathode of diodes 151b are connected to a coupling line 153 and the cathode of diodes 151a and the anodes of diodes 151b are connected to the metallic plating 152, i.e., ground. The diodes 151a, 151b are thermal compression bonded across the square apertures (not numbered) with the result that the 94 GHz signals passing therethrough produce a current flow which is "in phase" with the E-field of the 94 GHz radiation. That is to say, the diodes 151a, 151b are parallel to the incident E-field and therefore the H-field of the incident radiation will induce a current flow in the latter. The 93.9 GHz L.O. signal is optically coupled to the mixers 156 through the opposite side of the quartz substrate 137. However, since the E-field of the L.O. signal is orthogonally disposed in relationship to the 94.0 GHz signal, a quarter-wavelength monopole 155, disposed orthogonally to each pair of diodes 151a, 151b, is provided to couple the L.O. signal to each pair of diodes 151a, 151b.

The polarization grid 141 (FIG. 5) is effective not only to prevent the 94 GHz signal radiation from being coupled into the L.O. channel (not numbered), but also, axial movement of the former is effective to match the complex impedance of the mixers (not numbered) at the 94 GHz signal frequency. In like manner, the polarization grid 135 (FIG. 5) is effective to prevent the 93.9 GHz L.O. signal from entering the diplexer 15 (FIG. 3) and to match the complex impedance of the mixers (not numbered) and the monopoles 155 at the 93.9 GHz L.O. frequency. Because the polarization grids 135, 141 (FIG. 5) may be independently adjusted, matching of the mixers (not numbered) at both the signal and local oscillator frequency may be achieved over a relatively large bandwidth.

Low pass matching filters 157, fabricated in a co-planar line medium, are provided to couple the I.F. output signals from the mixers (not numbered) to the receiver 25 (FIG. 1). The design of such low pass matching filters is well known to those of skill in the art and will therefore not be recounted here.

Figure 7:
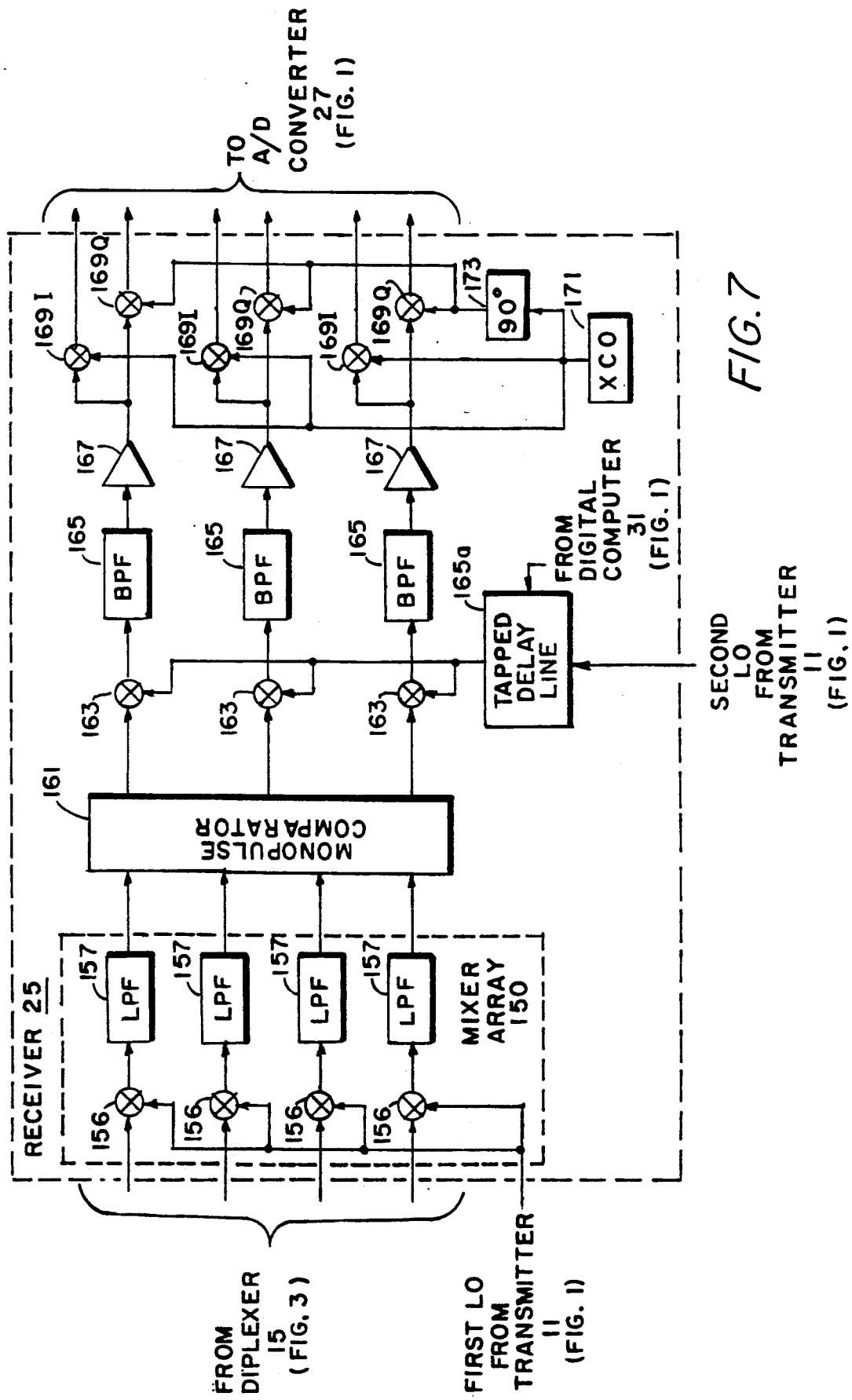
FIG. 7 is a simplified block diagram of the receiver of FIG. 1.

Referring now to FIG. 7, the operation of the receiver 25 will be described in detail Before proceeding, however, it should be noted that only half of the receiver 25 corresponding here to the so-called "left hand circular polarization channel" will be illustrated and described. It will be appreciated that the right hand circular channel (not shown) is identical to that described.

The first I.F. output signals from the mixer 156 in the mixer array 150 are passed through the low pass matching filters 157 to be combined in a conventional monopulse comparator 161 wherein monopulse sum, pitch and yaw error signals are developed. It will be appreciated that such monopulse signals are still chirped and they are therefore de-chirped (correlated) and upconverted to an L-band frequency by being heterodyned in mixers 163 with delayed replicas of the transmitted signals obtained by passing the second L.O. signals from the transmitter 11 (FIG. 2) through a conventional tapped delay line 165a that is shown to be controlled by a control signal provided by the digital computer 31 (FIG. 1). The output signals from the mixers 163 are filtered in bandpass filters 165 to remove undesired spurious signals developed within the mixers 163. The filtered output signals from the bandpass filters 165 are amplified in amplifiers 167 prior to being quadrature-detected and downconverted to baseband video signals by being heterodyned in mixers 169I, 169Q with in-phase (I) and quadrature phase (Q) output signals from an L-band crystal-controlled oscillator 171. The quadrature phase reference signals for the mixers 169Q are developed by passing a portion of the output signal from the crystal-controlled oscillator 171 through a 90° phase shifter 173. The baseband I and Q output signals from the receiver 25 are provided as input signals to the A/D converter 27 (FIG. 1).

Having described a preferred embodiment of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. An array comprising:
   (a) means for providing at least four apertures disposed about a region central to said four apertures; and
   (b) a plurality of pairs of diodes, each one of the plurality of pairs of diodes disposed in a corresponding one of the apertures, each diode having an anode and a cathode and disposed with the anode of one of the pair of diodes connected to the cathode of the other one of the pair of diodes.

2. The array as recited in claim 1 further comprising an output line connected to the anode of one of the pair of diodes and the cathode of the other one of the pair of diodes.

3. The array as recited in claim 2 wherein the pairs of diodes are beam lead diodes.

4. The array as recited in claim 3 wherein the output line comprises a center conductor of an electrical transmission line shaped to provide a low pass filter.

5. The array as recited in claim 4 further comprising:
   (a) means for optically coupling radio frequency energy to the plurality of apertures; and
   (b) means for optically coupling local oscillator signals to the plurality of apertures.

6. The array as recited in claim 5 wherein the radio frequency signals are passed in a first beam to the plurality of apertures and the local oscillator signals are passed in a second beam to the plurality of apertures.

7. The array as recited in claim 6 wherein the direction of polarization of the radio frequency signals and the local oscillator signals are orthogonal to each other.

8. A receiver comprising:
   (a) means, responsive to a local oscillator signal and a radio frequency signal, for providing a plurality of intermediate signals, wherein said providing means comprises a first, a second, a third and a fourth detector disposed about a central region on a substrate, each one of said detectors including a pair of diodes and wherein said radio frequency signal is optically coupled to said detectors; and
   (b) means, fed by said providing means for coupling each one of the plurality of intermediate signals to an output thereof.

9. The receiver as recited in claim 8 wherein said local oscillator signal is optically coupled to said providing means.

10. The receiver as recited in claim 9 wherein the coupling means comprises means for filtering each one of the plurality of intermediate frequency signals.

11. The receiver as recited in claim 10 wherein the plurality of intermediate frequency signals comprises at least four.

12. The receiver as recited in claim 11 wherein the direction of polarization of the radio frequency signals and the local oscillator signals are orthogonal to each other.

13. A monopulse receiver comprising:
   (a) a first, a second, a third and a fourth balanced detector disposed on a substrate, each one of said detectors including a pair of diodes having a junction between said pair;
   (b) means for optically coupling radio frequency signals to each pair of diodes;
   (c) means for optically coupling local oscillator signals to each pair of diodes; and
   (d) an output line electrically connected to the junction of each pair of diodes.

14. The monopulse receiver as recited in claim 13 wherein the pair of diodes are beam lead diodes.

15. The monopulse receiver as recited in claim 14 wherein the substrate comprises:
   (a) a sheet of dielectric material substantially transparent to the radio frequency energy to be detected; and
   (b) a metallic coating on one surface of the sheet of dielectric material, said coating having a first, a second, a third and a fourth opening formed therethrough and clustered about a central point on the common substrate, each one of said openings having a corresponding balanced detector disposed therein.

16. The monopulse receiver as recited in claim 15 wherein each one of said openings comprises a substantially square part and a substantially rectangular part joining a first side of the substantially square part at the center of said first side and extending to the periphery of the sheet of dielectric material.

17. The monopulse receiver as recited in claim 16 wherein the output line comprises a center conductor of an electrical transmission line disposed from the junction of each pair of beam-lead diodes to the periphery of the sheet of dielectric material.

18. The monopulse receiver as recited in claim 17 wherein the center conductor is shaped to provide a low pass filter.

19. The monopulse receiver as recited in claim 18 wherein the radio frequency signals to be detected are passed in a first beam to the common substrate and the local oscillator signals are passed in a second beam to the common substrate, with the directions of polarization and said two signals being orthogonal and the longitudinal axis of said two beams being orthogonal to the common substrate.

* * * * *